United States Patent [19]

Tanimoto et al.

[11] Patent Number: 4,803,382
[45] Date of Patent: Feb. 7, 1989

[54] VOLTAGE COMPARATOR CIRCUIT

[75] Inventors: Hiroshi Tanimoto, Kawasaki; Mikio Hayashibara, Tokyo, both of Japan

[73] Assignee: Kabushiki Kaisha Toshiba, Kawasaki, Japan

[21] Appl. No.: 136,974

[22] Filed: Dec. 23, 1987

[30] Foreign Application Priority Data

Dec. 25, 1986 [JP] Japan ................................. 61-307957

[51] Int. Cl.$^4$ ........................ H03K 5/08; H03K 5/24
[52] U.S. Cl. .................................. 307/362; 307/355; 307/360; 307/491; 307/494; 307/555; 330/51; 330/107
[58] Field of Search ............... 307/355, 356, 362, 360, 307/246, 350, 491, 494, 555; 330/51, 107; 333/173

[56] References Cited

U.S. PATENT DOCUMENTS

| | | | |
|---|---|---|---|
| 4,446,438 | 5/1984 | Chang et al. | 307/494 |
| 4,607,231 | 8/1986 | Nakayama | 330/51 |
| 4,616,145 | 10/1986 | Myers | 307/362 |
| 4,647,865 | 3/1987 | Westwick | 330/51 |

FOREIGN PATENT DOCUMENTS 0143111 6/1985 European Pat. Off. .
2111223 6/1983 United Kingdom .

OTHER PUBLICATIONS

IEEE Journal of Solid-State Circuits, vol. SC-20, No. 2, p. 620, Apr. 1985, Fig. 4; T. Habuka et al., Apr. 1985.

*Primary Examiner*—John Zazworsky
*Attorney, Agent, or Firm*—Oblon, Fisher, Spivak, McClelland & Maier

[57] ABSTRACT

In a voltage comparator circuit, among first and second signal voltages to be compared, the first signal voltage is input to a first input terminal of a differential voltage comparator through a first switched capacitor circuit, and the second signal voltage is input to a second input terminal of the differential voltage comparator through a second switched capacitor circuit. In the voltage comparator circuit, the first and second switched capacitor circuits are matched with each other.

8 Claims, 6 Drawing Sheets

VOLTAGE COMPARATOR CIRCUIT

BACKGROUND OF THE INVENTION

The present invention relates to a voltage comparator circuit for comparing a signal voltage with a reference voltage.

A voltage comparator circuit generally comprises an amplifer having a large gain. The voltage comparator cicuit is often used to compare magnitudes of various signal voltages and to change the operation and/or state of the system, device, or circuit in accordance with the comparison result. When an accurate comparison is required, the precision, i.e., the magnitude of the offset voltage of the voltage comparator circuit itself is important. When a voltage comparator circuit is incorporated in an integrated circuit, the magnitude of the offset voltage cannot be generally obtained in advance. More specifically, the offset voltage changes in accordance with the surrounding atmosphere (e.g., the ambient temperature) and/or the time lapse, and this change cannot be predicted. In addition, such an offset voltage cannot often be measured from outside. If such a voltage comparator circuit is used, the comparison determination level has uncertainty corresponding to the offset voltage. Therefore, in design of a voltage comparator circuit, the offset voltage must be suppressed as low as possible. Particularly, when an active element constituting a voltage comparator circuit is a MOSFET, the offset voltage is larger than a case wherein the active element comprises a bipolar transistor. In this case, the problem caused by the offset becomes serious.

Conventionally, several techniques for compensating the offset of an amplifier are proposed in order to solve the above problem. In these techniques, the offset voltage is charged in a capacitor by utilizing a very high input impedance of a MOSFET, and the offset of the amplifier is compensated using the charged capacitor voltage.

Figure 1A:
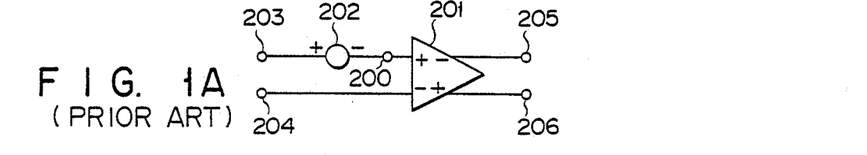
FIG. 1A is an equivalent circuit diagram for explaining a voltage comparator circuit having an offset.
Figure 1B:
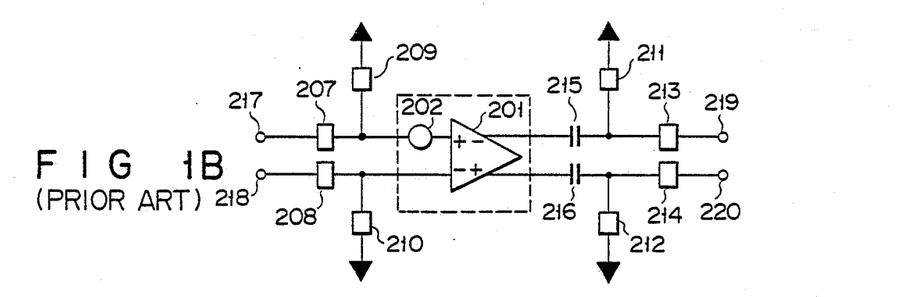
FIG. 1B is a view showing a conventional offset compensating voltage comparator.

For example, Poujois et al. published "A LOW DRIFT FULLY INTEGRATED MOSFET OPERATIONAL AMPLIFIER" (IEEE JOURNAL OF SOLID-STATE CIRCUIT, VOL. SC-13, No. 4, pp. 499–503, AUGUST 1978). FIGS. 1A and 1B are views for explaining the principle of the amplifier by Poujois et al.

FIG. 1A shows a voltage comparator circuit having an offset. In FIG. 1A, the offset voltage is extracted from the voltage comparator circuit for the sake of descriptive convenience. In this case, the voltage comparator circuit consists of differential voltage comparator 201 having no offset and voltage source 202 representing the offset voltage (originally included in comparator 201) extracted from comparator 201. FIG. 1A also shows positive phase input terminal 203 to which a voltage to be compared is applied, negative phase input terminal 204 to which a voltage as a comparative reference is applied, output terminals 205 and 206 of comparator 201, and positive phase input terminal 200 of comparator 201. The voltage comparator circuit shown in FIG. 1A has an offset. Therefore, when a voltage higher than reference voltage 204 by the offset voltage 202 or more is applied to input terminal 203, the voltage at output terminal 205 (206) becomes negative (positive) and has a level corresponding to the magnitude of the voltage applied to terminal 203. Inversely, when a voltage lower than reference voltage 204 is applied, the voltage at terminal 205 (206) becomes positive (negative) and has a level corresponding to the magnitude of the voltage applied to terminal 203. In short, an error in voltage comparison corresponding to offset voltage 202 occurs.

A circuit shown in FIG. 1B is used in order to compensate for the offset voltage. A voltage comparator circuit shown in FIG. 1B has switches 207 to 214 controlled from outside, and capacitors 215 and 216 to be charged with the offset voltage. In FIG. 1B, the circuit portion within a broken line corresponds to the voltage comparator circuit shown in FIG. 1A. FIG. 1B also shows input terminals 217 and 218 to which a voltage to be compared and a voltage as a comparison reference are applied, and output terminals 219 and 220 at which a signal corresponding to the comparison result is output.

Referring to FIG. 1B, initially switches 209 to 212 are closed and switches 207, 208, 213, and 214 are opened. One end of each of switches 209 to 212 is connected to an analog ground potential (to be indicated as $V_{AG}$). In this state, a voltage determined by offset voltage 202 appears at output terminals (205, 206) of voltage comparator circuit 201 and is charged in capacitor 215 and 216. Subsequently, switches 209 to 212 are opened and switches 207, 208, 213, and 214 are closed. Then, the voltage at output terminals (205, 206) of voltage comparator 201 takes a value determined by (voltage at input terminal 217) —(offset voltage 202)—(voltage at input terminal 218) . However, since capacitors 215 and 216 are already charged with a voltage determined by offset voltage 202, the voltages at terminals 219 and 220 are determined solely by (voltage at terminal 217)—(voltage at terminal 218) , and apparent offset voltage 202 is compensated. Therefore, when the switches are cyclically controlled to repeat these states, even if the offset of comparator 201 fluctuates, the offset is periodically compensated at the switching cycle of the switches, and a highly precise voltage comparison result can be obtained. In this example, the offset is compensated at the output side. Therefore, the circuit must be designed such that the gain of the voltage comparator may not become excessive, thus preventing the output voltage from being saturated by the offset voltage.

Voltage comparators using MOSFETs are often operated by a single power source voltage ($V_{DD}$). In this case, analog ground potential $V_{AG}$ is generally selected to be $V_{DD}/2$ in consideration of the dynamic range of the circuit. However, the reference voltage of the voltage comparison is often a voltage ($V_{AG}+\Delta V$ or $V_{AG}-\Delta V$) which is deviated from potential $V_{AG}$ by $\Delta V$, and in some cases $\Delta V$ is externally supplied with reference to the power source of 0 V as a reference. In this case, voltage $\Delta V$ externally supplied is level-shifted to $V_{AG}+\Delta V$ or $V_{AG}-\Delta V$ in order to generate a reference voltage of the voltage comparator. However, if the circuit for the level shift has an offset, an accurate comparison result cannot be obtained no matter how correct the voltage comparator itself may be. Therefore, an offset compensating operational amplifier is conventionally used as a level shifter. For example, IEEE Journal of Solid-State Circuits, T. Habuka et al. Vol. SC-20, No. 2, April 1985, p. 620, FIG. 4 shows a "REFERENCE CONVERTER" for level-shifting $\Delta V$ to $V_{AG}+\Delta V$ and $VAG-\Delta V$. An output from the "REFERENCE CONVERTER" is compared with a signal "IN" and an accurate comparison result can be obtained.

However, since a reference voltage generator, i.e., a level shifter must be provided in order to constitute a voltage comparator, the size of the entire voltage comparator becomes large. In addition, when the circuit size becomes large, the reliability may be degraded, resulting in disadvantage in terms of economy.

As described above, in the conventional voltage comparator circuit, in order to generate a reference voltage of a voltage comparator, a special level shifter must be provided independently of the voltage comparator.

SUMMARY OF THE INVENTION

It is an object of the present invention to provide a voltage comparator circuit which can enable level comparison at high precision without substantially increasing the circuit size.

The voltage comparator circuit according to the present invention is characterized in that voltages to be compared are applied to positive and negative phase input terminals of a differential voltage comparator circuit respectively through first and second switched capacitor circuits each comprising switching elements and capacitor circuits. The switching and capacitor elements of the first switched capacitor circuit are matched with those of the second switched capacitor circuit.

A first signal voltage is applied directly to the positive phase input terminal of the differential voltage comparator circuit through the first switched capacitor circuit. A voltage obtained by subtracting or adding a second signal voltage from or to a reference voltage is applied to the negative phase input terminal of the voltage comparator circuit through the second switched capacitor circuit. The elements of the first switched capacitor circuit are matched with corresponding ones of the second switched capacitor circuit. Therefore, voltage comparison itself including level shifting is performed accurately despite that level shifting itself can include an error. As a result, according to the present invention, voltage comparison including accurate level shifting can be performed by adding only a simple circuit comprising a switched capacitor to a conventional voltage comparator. A level shifter using a special low-offset amplifier need not be provided.

With the voltage comparator circuit according to the present invention, voltage comparison relatively free from leakage of the control clock signals of the switches and including accurate level shifting can be achieved. As a result, a high-precision amplitude comparator circuit can be obtained without using a special level shifter, thus resulting in advantages in reliability and economy.

DETAILED DESCRIPTION OF THE PREFERRED EMBODIMENTS

Voltage comparator circuits according to the preferred embodiments of the present invention will be described with reference to the accompanying drawings.

Figure 2:
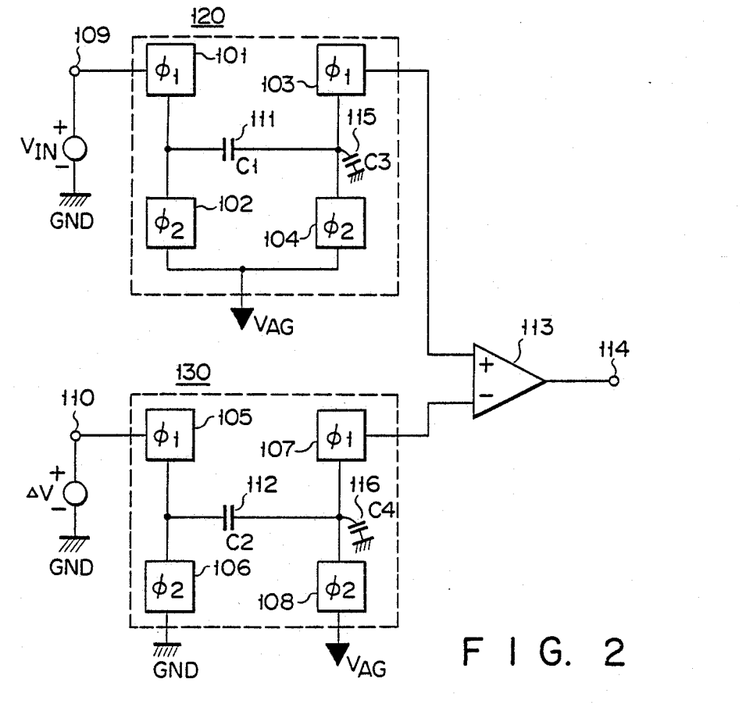
FIG. 2 is a circuit diagram showing an arrangement of a voltage comparator circuit according to a first embodiment of the present invention.

FIG. 2 is a circuit diagram showing an arrangement of a voltage comparator circuit according to a first embodiment of the present invention.

Switches 101 to 108 are opened/closed by control signals to be described later. Switches 102, 104, and 108 are connected to the first fixed potential point $V_{AG}$, and switch 106 is connected to second fixed potential point GND. A reference signal voltage ($\Delta V$) is input from terminal 110, and a signal voltage ($V_{IN}$) to be compared with voltage $\Delta V$ is input from terminal 109. Capacitor 111 and switches 101 to 104 constitute first switched capacitor circuit 120, and capacitor 112 and switches 105 to 108 constitute second switched capacitor circuit 130. Outputs from first and second switched capacitor circuits 120 and 130 (both outputs are output through switches 103 and 107, respectively) are input to positive phase (non-inverting) and negative phase (inverting) input terminals of differential voltage comparator 113, respectively. Note that the parasitic capacitances of capacitors 111 and 112 are indicated as capacitors 115 and 116, respectively.

The operation of the circuit shown in FIG. 2 will be described.

Initially, switches 101, 103, 105, and 107 (to be referred to as "first switch group") are turned off, and switches 102, 104, 106, and 108 (to be referred to as "second switch group") are turned on. Subsequently, the first switch group is turned on, and second switch group is turned off (second state). The first and second states are alternately repeated.

More specifically, switches 101 to 108 comprise MOSFETs. The gates of the MOSFETs of the first and second switch groups may be driven by two types of cyclic complementary control clock signals which do not overlap each other. For example, the gates of the MOSFETs of the first switch group are driven by signal $\phi 1$ shown in FIG. 3A, and the gates of the MOSFETs of the second switch group are driven by signal $\phi 2$ shown in FIG. 3B. In the first state, capacitor 111 is not charged. Thus, if comparator 113 comprises, e.g., a MOSFET and its input impedance is very large, signal voltage $V_{IN}$ to be compared is applied directly to its positive phase input terminal. Meanwhile, since signal voltage $\Delta V$ as a reference is connected to the negative phase input terminal of comparator 113 through capacitor 112 which is already charged with voltage $V_{AG}$ in the first state, a voltage $(V_{AG}+\Delta V)$ is applied to the negative phase input terminal of comparator 113. Then, a voltage $(V_{AG}+\Delta V)$ obtained by level-shifting $\Delta V$ and voltage $V_{IN}$ are compared by comparator 113, and in this state (the periods indicated by hatched regions in FIGS. 3A and 3B) a voltage corresponding to the level relationship between the two voltages is output at output terminal 114 of comparator 113. Namely, level shifting from $\Delta V$ to $(V_{AG}+\Delta V)$ is performed at the time of voltage comparison. This voltage comparator circuit enables the level shifting function without using a complex level shifter. Such a comparator is quite effective when fabricated in an LSI.

A practical capacitor or switch has parasitic capacitances. The influence of such parasitic capacitances will be discussed.

In the first embodiment shown in FIG. 2, an electrode of capacitor 111 which is connected to switches 101 and 102, and an electrode of capacitor 112 which is connected to switches 105 and 106 are always connected to a low impedance point, i.e., a signal voltage or fixed potential point regardless of the states of the switches. Thus, the parasitic capacitance of the above-described electrodes of capacitors 111 and 112 do not influence the operation of the entire circuit. However, electrodes of capacitors 111 and 112 which are opposite to the electrodes described above (electrodes connected to switches 103 and 104; 107 and 108) are connected to a high-impedance input terminal of the amplitude comparator depending on the states of the switches, and the circuit is substantially opened. As a result, the parasitic capacitances of these electrodes cannot be neglected and influence the operation of the circuit. In FIG. 2, these parasitic capacitances are indicated as capacitors 115 and 116. When parasitic capacitor 115 is present, assuming that the capacitances of capacitors 111 and 115 are denoted as C1 and C3, signal voltage $V_{IN}$ is divided by capacitances C1 and C3, and the voltage applied to the positive phase input terminal of comparator 113 is $$\{C1/(C1+C3)\} \cdot V_{IN}$$

and is decreased from initial signal voltage $V_{IN}$. At the same time, when parasitic capacitor 116 is present, assuming that the electrostatic capacities of capacitors 112 and 116 are denoted as C2 and C4, respectively, the voltage applied to the negative phase input terminal of comparator 113 is $$\{C2/(C2+C4)\} \cdot (V_{AG}+\Delta V)$$

and voltage $(V_{AG}+\Delta V)$ is decreased in accordance with the voltage dividing ratio of C2 and C4. Thus, voltage $\Delta V$ is not level-shifted correctly.

However, in the voltage comparator circuit having the arrangement shown in FIG. 2 according to the first embodiment of the present invention, since first and second switched capacitor circuits 120 and 130 comprise matched elements, it is estimated that C1=C2 and C3=C4. Accordingly, the input voltage to the positive phase input terminal of comparator 113 is $$\{C1/(C1+C3)\} \cdot V_{IN}$$

and the input voltage to its negative phase input terminal is $$\{C1/(C1+C3)\} \cdot (V_{AG}+\Delta V)$$

Both inputs are divided similarly and are thus decreased. As a result, voltage comparison itself including level shifting is performed accurately. However, when the parasitic capacitances become large, a decrease in signal caused by voltage division is increased. Therefore, although the accuracy of voltage comparison is maintained, the response time of the voltage comparison becomes prolonged (the response time of the voltage comparison is related to the gain of comparator 113). For this reason, it is preferable to sufficiently increase the electrostatic capacitances of capacitors 111 and 112 as required in comparison to those of parasitic capacitors 115 and 116.

A voltage comparator circuit according to a second embodiment of the present invention will be described with reference to FIG. 4.

In the second embodiment, only the switching combination of switches 401 to 408 is different from that of switches 101 to 108 of the first embodiment shown in FIG. 2. Except that, the second embodiment is substantially the same as the first embodiment. The portions in FIG. 4 which are similar to those shown in FIG. 2 are denoted by the same reference numerals.

Initially, a first state is set. More specifically, a switch group consisting of switches 401, 403, 406, and 407 (referred to as "a first switch group" in this embodiment and driven by clock signal $\phi 1$) is turned off and a switch group consisting of switching elements 402, 404, 405, and 408 (referred to as "a second switch group" in this embodiment and driven by clock signal $\phi 2$) is turned on. Subsequently, a second state is set wherein the first and second switch groups are turned on and off, respectively. The first and second states are alternately repeated. In this case, analog ground potential $V_{AG}$ similar to that of FIG. 2 is set. The operation of first switched capacitor circuit 420 (consisting of capacitors 111 and 115 and switches 401 to 404) is similar to that of circuit 120 shown in FIG. 2. At first, when the switches are set at the first state, capacitor 112 of second switched capacitor circuit 430 (consisting of capacitors 112 and 116 and switches 405 to 408) is connected between $\Delta V$ and potential point $V_{AG}$. Thus, capacitor 112 is charged with a voltage $(V_{AG}-\Delta V)$ by the switch 408 side as its positive side. Then, the states of the first and second switch groups are reversed and the second state is set. Capacitor 112 is then connected between zero potential point GND and the negative phase input terminal of comparator 113. Since capacitor 112 is already charged with the voltage $(V_{AG}-\Delta V)$, this voltage is applied directly to the negative phase input terminal of comparator 113. Voltage $V_{IN}$ is applied to the positive phase input terminal of comparator 113 in the same manner as in FIG. 2. In fine, in this state (corresponding to the period indicated by hatched portions in FIGS. 3A and 3B), a voltage corresponding to the level relationship between $V_{IN}$ and $(V_{AG}-\Delta V)$ appears at output terminal 114 of comparator 113. In other words, level shifting from $\Delta V$ to $(V_{AG}-\Delta V)$ is performed simultaneously with amplitude comparison. Neither parasitic capacitor 115 nor 116 affects the result of the amplitude comparison similarly to the first embodiment shown in FIG. 2.

Figure 5:
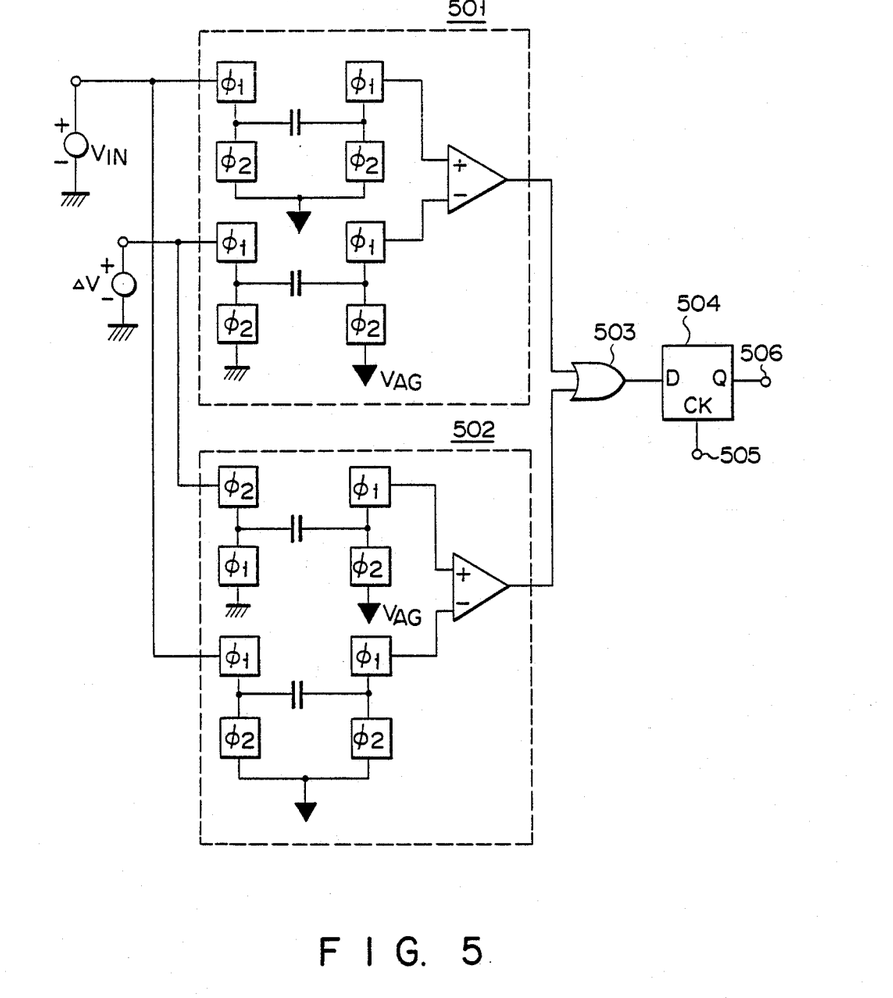
FIG. 5 is a circuit diagram showing an arrangement of a window comparator according to a third embodiment of the present invention.

FIG. 5 shows the arrangement of a window comparator according to a third embodiment of the present invention.

Figure 4:
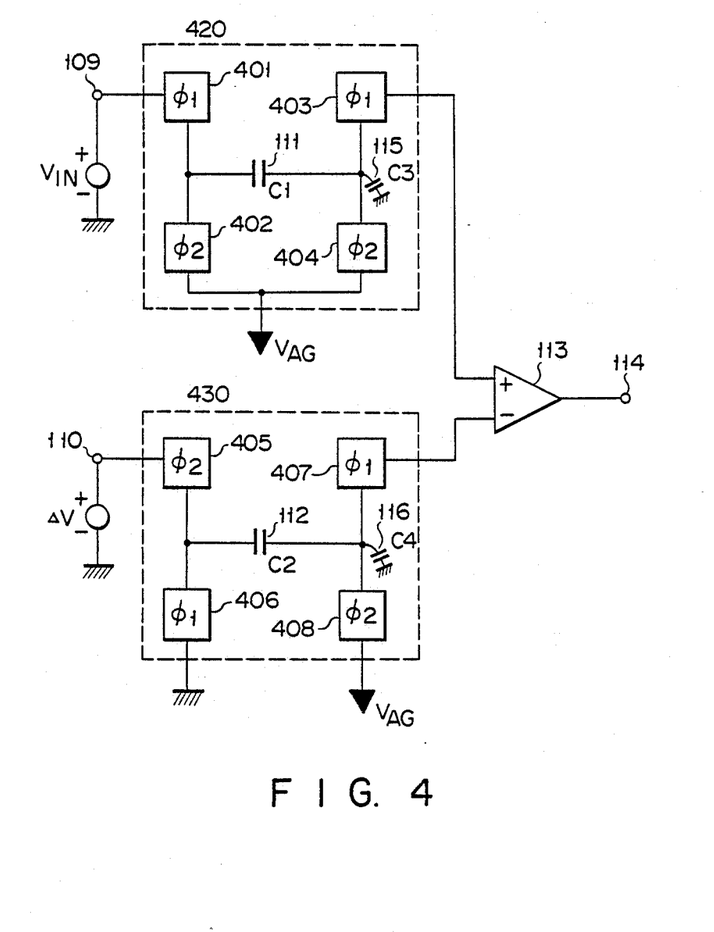
FIG. 4 is a circuit diagram showing an arrangement of a voltage comparator circuit according to a second embodiment of the present invention.

The window comparator comprises first voltage comparator circuit 501 having an arrangement similar to that shown in FIG. 2, second voltage comparator circuit 502 having an arrangement similar to that shown in FIG. 4 and obtained by modifying the input terminal of comparator 113 shown in FIG. 4, OR gate 503, and latch circuit 504. FIG. 5 also shows latch control input terminal 505 of latch circuit 504, and output terminal 506 of latch circuit 504.

Figure 3A:
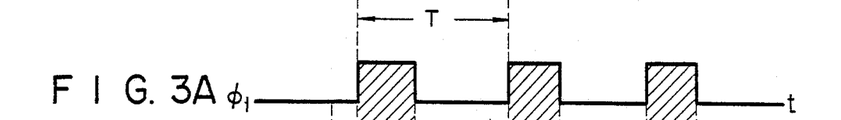
FIGS. 3A and 3B are waveform charts showing examples of a switch control clock signal of the circuit shown in FIG. 2.
Figure 3B:
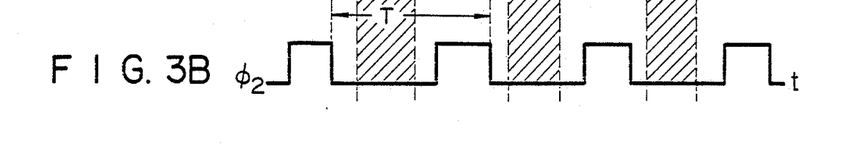

An output from first comparator circuit 501 is "H" when $V_{IN} > (V_{AG} + \Delta V)$ during the ON period of the first switch group operated by clock signal $\phi 1$. An output from second comparator circuit 502 is "H" when $V_{IN} < (V_{AG} - \Delta V)$ during the ON period of the first switch group operated by clock signal $\phi 1$. Thus, in this case, an output from OR gate 503 is "H" when $V_{IN} > V_{AG} + \Delta V$ or $V_{IN} < V_{AG} - \Delta V$. However, since the output level of comparator circuits 501 and 502 is unstable during the OFF period of the first switch group, latch circuit 504 is connected to the output of OR gate 503. More specifically, a signal to cause a latch operation is supplied to latch control input terminal 505 of latch circuit 504, and the output of OR gate 503 during a period indicated by the hatched portions in FIGS. 3A and 3B is latched by latch circuit 504. As a result, a correct comparison result can always be obtained at output terminal 506 of latch circuit 504.

Referring to the arrangements of FIGS. 2 and 4, when comparator 113 has an offset, an error corresponding to the offset naturally occurs. Therefore, an offset compensating voltage comparator as shown in FIG. 1B is preferably used in this case.

Figure 6:
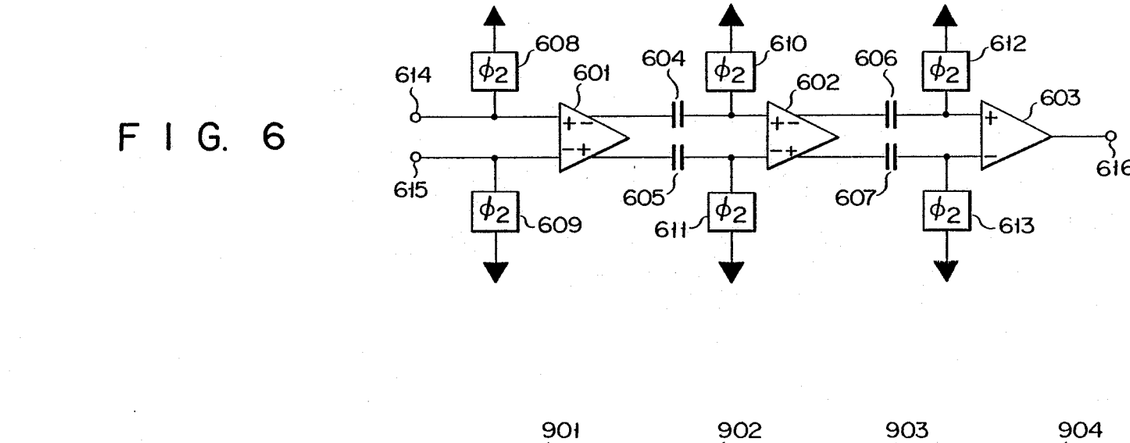
FIG. 6 shows an arrangement of a differential voltage comparator suitably applied to the circuit shown in FIG. 2 or 4.

FIG. 6 is a circuit diagram showing a practical arrangement of an offset compensating voltage comparator suitably used as comparator 113 shown in FIGS. 2 and 4. The circuit shown in FIG. 6 has differential input type voltage comparators 601 to 603, capacitors 604 to 607 (for offset compensation), and switching elements 608 to 613. In this circuit, a comparison result of voltages input from positive and negative phase input terminals 614 and 615 is output from output terminal 616. The differential voltage comparator shown in FIG. 6 comprises two voltage comparators (consisting of comparators 601 and 602 and capacitors 604 to 607) whose offset compensation operations are performed at their output sides, and voltage comparator 603 to which no offset compensation is performed. Even if comparator 603 has an offset, when the gains of the two comparators are large, the final entire offset (voltage) is (offset of comparator 603)/(gain of the two comparators 601 and 602) and can be sufficiently decreased. Although two input comparators for offset compensation are provided in FIG. 6, at least one comparator can be provided as required. When a comparator having the above arrangement is used in the circuit shown in FIG. 2 or 4, switching elements 608 to 613 may be turned on/off in the same manner as in the second switch group in FIG. 2 or 4, so that a correct voltage comparison result can be obtained at output terminal 616 during a period wherein the first and second switch groups are ON and OFF, respectively.

In the arrangement shown in FIG. 2 or 4, if MOSFETs are used as the switches, control clock signals for the switches are undesirably leaked through the parasitic capacitors of the gate electrodes. However, in the circuit of the present invention, the switching elements at the input side are matched and are driven by the same control clock signal. Therefore, the signals leaked through the parasitic capacitors of the gate electrodes are canceled with each other by the common mode rejection function of the differential voltage comparator and will not influence the output of the differential voltage comparator. This is one of the advantages of the circuit of the present invention.

A voice limiter according to a fourth embodiment of the present invention, to which the arrangement of the main part of the window comparator shown in FIG. 5 according to the third embodiment of the present invention is applied, will be described with reference to the accompanying drawings.

The technical background of voice limiters will be briefly described below.

At present, in the mobile radio communication regulated by the radio law of Japan, the frequency deviation of a transmission signal is limited within a range of, e.g., $\pm 5$ kHz so that, when a high-level (i.e., large amplitude) modulation signal is input, the sideband is prevented from spreading to interfere with an adjacent radio channel. For this purpose, in PM (Phase Modulation), for example, not only the level of the modulation signal must be limited but also, particularly, a high-frequency signal component must be suppressed to a low level as much as possible since the magnitude of the frequency deviation can be proportional not only to the level of the modulation signal but also to its frequency. In order to achieve this, an instantaneous deviation control (IDC) circuit (to be referred to as an "IDC circuit" hereinafter) is conventionally used.

Figure 7:
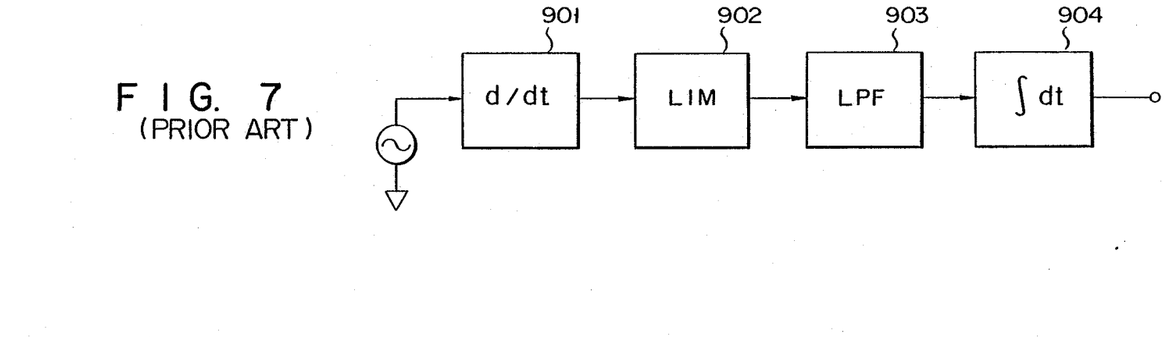
FIG. 7 is a block diagram showing an arrangement of an example of a conventional instantaneous deviation control circuit (IDC)

The principle of the IDC circuit will be briefly described with reference to FIG. 7. An original input modulation signal is first differentiated by differentiator 901 to emphasize its high-frequency component, and its voltage amplitude is clipped to a level under a predetermined value by limiter 902. The waveform clipped by limiter 902 includes a high-frequency component due to the clipping. Low-pass filter 903 called a splatter filter is connected to the output of limiter 902 in order to remove the high-frequency component. The signal from which the high-frequency component is removed by filter 903 is passed through integrator 904 having frequency characteristics opposite to differentiator 901. As a result, a signal having an amplitude lower than a predetermined value and a high frequency component can be obtained. Thus obtained signal is to be modulated.

A voice signal processor using such an IDC circuit conventionally comprises a hybrid circuit. Therefore, a large number of circuit components and adjustments are required. However, when a mobile communication system using such a circuit is to be made small and at low cost, naturally the number of components must be largely decreased and the circuit arrangement must be simplified. In the case of a wireless mobile communication system, power consumption must also be decreased.

A MOS-LSI voice signal processor is almost realized by the development in the switched capacitor technique. Such a voice signal processor not only satisfies the above requirements but also achieves a high-precision, high-stability communication system.

An example of a conventional voice limiter used as limiter 902 in the MOS-LSI voice signal processor will be described.

Figures 8, 9:
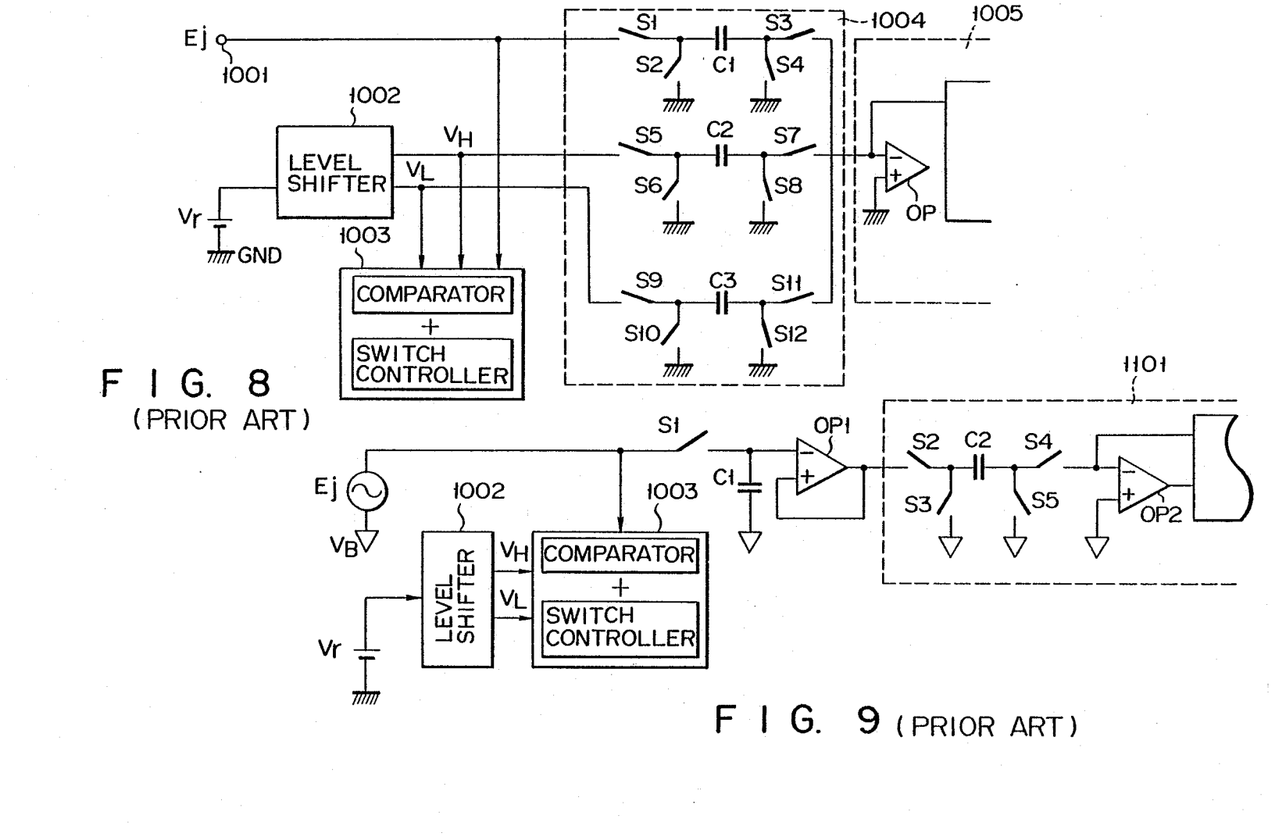
FIGS. 8 and 9 are circuit diagrams showing different arrangements of conventional limiters using switched capacitor circuits.

FIG. 8 schematically shows an arrangement of a voice limiter shown in IEEE Journal of Solid-State Circuits, T. Habuka et al. Vol. SC-20, No. 2, April 1985, pp. 619–620 mentioned earlier.

Reference voltage Vr with reference to ground voltage GND is converted into upper and lower limit voltages $V_H$ and $V_L$ by level shifter 1002. Voltages $V_H$ and $V_L$ and input signal Ei from input terminal 1001 are input to comparator/switch controller 1003 comprising a comparator and a switch control logic circuit. Comparator/switch controller 1003 supplies a control signal (clock) to next selector 1004 in accordance with the comparison result of the three signals. Selector 1004 consists of switches S1 to S12 and capacitors C1 to C3. A first switch group (switches S1, S4, S5, S8, S9, and S12) and a second switch group (switches S2, S3, S6, S7, S10, and S11) are driven by complementary clock signals which are not enabled simultaneously.

(1) When input signal Ei is larger than voltage $V_H$, switches S2, S3, S10, and S11 are turned off and switches S6 and S7 are turned on, and capacitor C2 is discharged.

(2) When input signal Ei is smaller than voltage VL, switches S2, S3, S6, and S7 are turned off and switches S10 and S11 are turned on, and capacitor C3 is discharged.

(3) When input signal Ei has a value between voltages $V_H$ and $V_L$, switches S6, S7, S10, and S11 are turned off and switches S2 and S3 are turned on, and capacitor C1 is discharged.

As a result, a voltage higher than voltage $V_H$ or lower than voltage $V_L$ is not supplied to operational amplifier OP at an input stage of new low-pass filter 1005.

FIG. 9 schematically shows an arrangement of a limiter shown in Oki Denki Kenkyu Kaihatsu Dai-127 go, Vol. 62, No. 3. A control signal (clock) is supplied from comparator/switch controller 1003 to turn on switch S1 when input signal Ei has a value between upper and lower limit voltages $V_H$ and $V_L$, and to turn off switch S1 otherwise. When switch S1 is ON, signal Ei appears directly at the output of operational amplifier OP1; when OFF, a voltage immediately before an input signal exceeds or is less than the upper or lower limit voltage, respectively, is held in capacitor C1, buffered and extracted by amplifier OP1. Therefore, a voltage higher or lower than the upper or lower limit voltage is not input to low-pass filter 1101.

However, the circuits shown in FIGS. 8 and 9 require a voltage source having upper and lower limit voltages $V_H$ and $V_L$ with reference to a reference potential. For this purpose, in FIG. 8, voltages $V_H$ and $V_L$ are generated by reference voltage Vr with reference to a ground potential and input to selector 1004, and the capacitors are discharged in accordance with the comparison result of comparator/switch controller 1003. In this method, level shifter 1002 is required to generate voltages $V_H$ and $V_L$ to be input to selector 1004. The operational amplifier in level shifter 1002 increases the entire circuit size and power consumption. With reference to FIG. 9, level shifter 1002 is required to input voltages in comparator/switch controller 1003, and operational amplifier OP1 is also required to buffer the voltage held by capacitor C1 when switch S1 is turned off.

Figure 10:
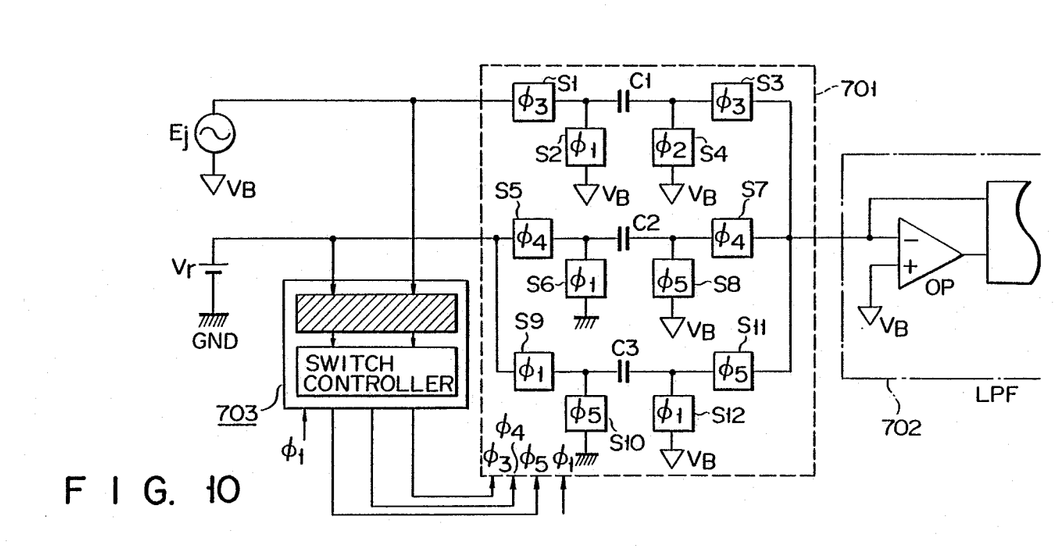
FIG. 10 is a circuit diagram showing an arrangement of a limiter according to the third embodiment of the present invention.
Figure 11:
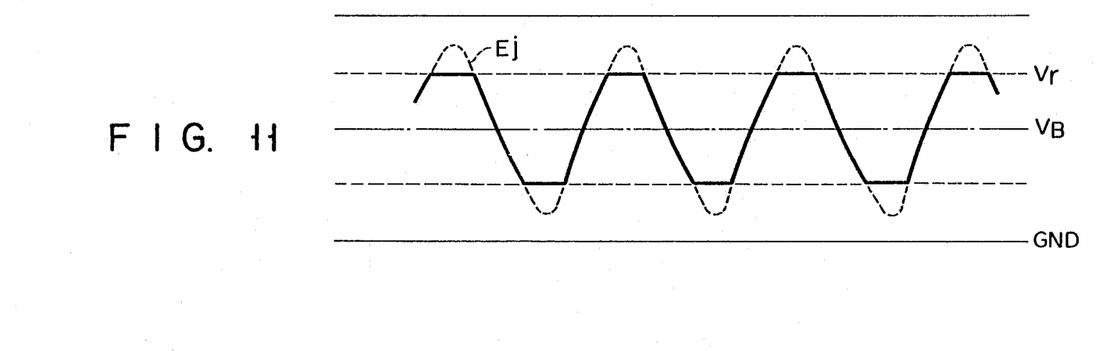
FIG. 11 is a waveform chart of an output of the circuit shown in FIG. 10.

The voice limiter according to the fourth embodiment of the present invention has the arrangement shown in FIG. 10. Since the voice limiter adopts the window comparator shown in FIG. 5, its arrangement can be simplified. The hatched portion of comparator/switch controller 703 shown in FIG. 10 is constituted by a circuit obtained by applying the circuit shown in FIG. 6 to the circuit portion of FIG. 5 encircled by the broken line.

Signal source Ei changes its voltage with reference to circuit reference potential $V_B$. A switch group ((S1, S3) (S5, S7) (S10, S11)) and a switch group (S2, S4, S6, S8, S9, and S12) are driven by complementary clock signals which are turned on/off such that they are not ON simultaneously. Electrodes of switches S2, S4, S8, and S12 that are not connected to corresponding capacitors and a positive phase input terminal of input stage operational amplifier OP of next low-pass filter LP are connected to reference potential $V_B$, and electrodes of switches S6 and S10 that are not connected to corresponding capacitors are connected to ground potential GND.

Comparator/switch controller 703 operates the switch as follows depending on signal Ei and reference voltage Vr with reference to ground potential GND. When the voltage level of signal source Ei is higher than the upper limit voltage level, switches S3 and S11 are held OFF during a period in which they must be ON. When the voltage level of source Ei is lower than the lower limit voltage level, switches S3 and S7 are held OFF during a period in which they must be ON. When the voltage of input signal Ei is between the upper and lower limit voltages, switches S7 and S11 are held OFF during a period in which they must be ON.

(1) When signal Ei exceeds the upper limit voltage, only a switched capacitor circuit consisting of switches S5, S6, S7, and S8 and capacitor C2 can transfer charge to operational amplifier OP. In this case, the electrode of switch S6 not connected to a corresponding capacitor is connected to ground potential GND. Therefore, while switches S6 and S8 are ON, charge $$Q_{C2} = -C2 V_B$$

is accumulated in capacitor C2. Subsequently, when switches S5 and S7 are turned on, charge $$Q_{C2}' = -C2(V_B - Vr)$$

is supplied to capacitor C2. The charge $$\Delta Q_{C2} = Q_{C2}' - Q_{C2} = C2 Vr$$

namely, charge corresponding to the upper limit voltage is supplied to operational amplifier OP.

(2) When signal Ei is lower than the lower limit voltage, only the switched capacitor circuit consisting of switches S9, S10, S11, and S12 and capacitor C3 can transfer charge to operational amplifier OP. While switches S9 and S12 are ON, charge $$Q_{C3} = -C3(V_B - Vr)$$

is accumulated in capacitor C3. Subsequently, when switches S10 and S11 are turned on, charge $$Q_{C3}' = C3 V_B$$

is accumulated in capacitor C3. A difference between charges $$\Delta Q_{C3} = Q_{C3}' - Q_{C3} = C3 Vr$$

namely, charges corresponding to the lower limit voltage are transferred to operational amplifier OP.

(3) When signal Ei has a value between the upper and lower limit voltages, only the switched capacitor circuit consisting of switches S1, S2, S3, and S4 and capacitor C1 can transfer charge to operational amplifier OP. While switches S2 and S4 are ON, charge $$Q_{C1}=0$$

is accumulated in capacitor C1. Subsequently, when switches S1 and S3 are turned on, charge $$Q_{C1}'=C1Ei$$

is accumulated in capacitor C1. The difference in the charges $$\Delta Q_{C1}=Q_{C1}'-Q_{C1}=C1Ei$$

namely, charges corresponding to input signal Ei are transferred to amplifier OP.

As described above, the electrodes of switches S6 and S10, and S8 and S12 that are not connected to the corresponding capacitors are connected to ground potential GND and reference potential $V_B$, respectively. As a result, charges corresponding to the upper and lower limit voltages with reference to reference voltage VB can be transferred to operational amplifier OP from reference voltage source Vr with reference to ground potential GND by using a simple conventional switched capacitor circuit without using a special circuit. In addition, since each of these switched capacitor circuits described above also serves as an input switched capacitor circuit for next low-pass filter 702, no additional buffer operational amplifier is needed.

In FIG. 10, the switched capacitor circuit consisting of switches S9, S10, S11, and S12 can be omitted, and the function of two switched capacitor circuits may be obtained only by the switched capacitor circuit consisting of switches S5, S6, S7, and S8 and capacitor C2. In this case, selection can be made so that switches of the switch group (S5 and S8), or switches of the switch group (S6 and S7) may be complementarily turned on/off as required.

As described above, the two terminals of the switched capacitor circuit that must conventionally be connected to a reference potential in the circuit are connected to ground potential GND and reference potential $V_B$, respectively. Then, when charge corresponding to the difference between reference potential VB and ground potential GND is left in the switched capacitor circuit which must conventionally be completey discharged, a reference voltage with reference to the ground potential can be converted into upper and lower limit voltages with reference to the reference potential in the circuit without using any special circuit.

For example, in the conventional limiter shown in FIG. 8, in the switched capacitor circuit consisting of switches S5, S6, S7, and S8 and capacitor C2, one end of each of switches S6 and S8 is connected to reference potential $V_B$ of the circuit. Switches S5 and S8 and switches S6 and S7 are turned on/off by complementary clock signals. The positive phase input terminal of operational amplifier OP is connected to reference potential $V_B$ in the circuit, and its negative phase input terminal is connected to capacitor C2 through switch S7. Therefore, while switches S5 and S8 are ON and switches S6 and S7 are OFF, charge corresponding to $(V_H - V_B)C2$ is accumulated in capacitor C2. Subsequently, when switches S5 and S8 are turned off and switches S6 and S7 are turned on, the positive phase input terminal of amplifier OP is connected to potential $V_B$, and thus all the charge in capacitor C2 is transferred. Therefore, upper limit voltage $V_H$ must be level-shifted by some means to $Vr+V_B$. Then, the charge corresponding to the net VrC2 is input to next filter 1005.

In contrast to this, in the switched capacitor circuit of FIG. 10 consisting of switches S5, S6, S7, and S8 and capacitor C2, one end of switch S6 is connected to a ground potential, and one end of switch S8 is connected to reference potential $V_B$ of the circuit. The arrangement of FIG. 10 is different from that of FIG. 8 in these respects. Therefore, in the switched capacitor circuit shown in FIG. 10, while switches S5 and S8 are ON and switches S6 and S7 are OFF, capacitor C2 accumulates the charge corresponding to $(V_B-Vr)C2$. Subsequently, when switches S5 and S8 are turned off and switches S6 and S7 are turned on, capacitor C2 is not completely discharged since the positive phase input of operational amplifier OP is connected to potential $V_B$, and only the charge corresponding to the net VrC2 is discharged and input to next filter 702. Therefore, the charge corresponding to the net VrC2 need not particularly be level-shifted and can be input to filter 702 at a required level (Vr in this case).

As described above, in the limiter shown in FIG. 10, partly because of the arrangement of the voltage comparator circuit (included in the hatched portion in FIG. 10), the upper and lower limit voltages need not be separately set at all, and no additional buffer operational amplifier is needed. As a result, both the circuit size and power consumption are decreased, thus resulting in economical advantages.

What is claimed is:

1. A voltage comparator circuit comprising:
a first switched capacitor circuit for receiving a first signal voltage to be compared, said first switched capacitor circuit having a first switching element connected between an input terminal of said first signal voltage and one terminal of a first capacitor, a second switching element connected between said one terminal of said first capacitor and a first fixed potential point, a third switching element connected between an output terminal of said first switched capacitor circuit and the other terminal of said first capacitor, and a fourth switching element connected between the other terminal of said first capacitor and said first fixed potential point;
a second switched capacitor circuit for receiving a second signal voltage to be compared, said second switched capacitor circuit having a fifth switching element connected between an input terminal of said second signal voltage and one terminal of a second capacitor, a sixth switching element connected between said one terminal of said second capacitor and a second fixed potential point, a seventh switching element connected between an output terminal of said second switched capacitor circuit and the other terminal of said second capacitor, and an eighth switching element connected between the other terminal of said second capacitor and said first potential point, said second switched capacitor circuit matching with said first switched capacitor circuit; and
a differential voltage comparator having first and second input terminals for receiving outputs from said first and second switched capacitor circuits, respectively.

2. A circuit according to claim 1, wherein said differential voltage comparator is a sampled data differential input voltage comparator for performing offset compensation at a voltage held by a capacitor connected to an output of said differential voltage comparator.

3. A circuit according to claim 1, wherein said first, third, fifth, and seventh switching elements are driven by a first control clock signal, and said second, fourth, sixth, and eighth switching elements are turned on/off by a second control clock signal which is complementary with said first control clock signal and is not enabled simultaneously therewith.

4. A circuit according to claim 1, wherein said first, third, sixth, and seventh switching elements are driven by a first control clock signal, and said second, fourth, fifth, and eighth switching elements are turned on/off by a second control clock signal which is complementary with said first control clock signal and is not enabled simultaneously therewith.

5. A window comparator circuit comprising:
a first voltage comparator comprising a first switched capacitor circuit for receiving a first signal voltage to be compared, said first switched capacitor circuit having a first switching element connected between an input terminal of said first signal voltage and one terminal of a first capacitor, a second switching element connected between said one terminal of said first capacitor and a first fixed potential point, a third switching element connected between an output terminal of said first switched capacitor circuit and the other terminal of said first capacitor, and a fourth switching element connected between the other terminal of said first capacitor and said first fixed potential point, a second switched capacitor circuit for receiving a second signal voltage to be compared, said second switched capacitor circuit having a fifth switching element connected between an input terminal of said second signal voltage and one terminal of a second capacitor, a sixth switching element connected between said one terminal of said second capacitor and a second fixed potential point, a seventh switching element connected between an output terminal of said second switched capacitor circuit and the other terminal of said second capacitor, and an eighth switching element connected between the other terminal of said second capacitor and said first fixed potential point, said second switched capacitor circuit matching with said first switched capacitor circuit, and a first differential voltage comparator having first and second input terminals for receiving outputs from said first and second switched capacitor circuits, respectively, said first, third, fifth, and seventh switching element being driven by a first control clock signal, and said second, fourth, sixth, and eighth switching elements being turned on/off by a second control clock signal which is complementary with said first control clock signal and is not enabled simultaneously therewith;
a second voltage comparator circuit comprising a third switched capacitor circuit for receiving said first signal voltage, said third switched capacitor circuit having a ninth switching element connected between said input terminal of said first signal voltage and one terminal of a third capacitor, a tenth switching element connected between said one terminal of said third capacitor and said first fixed potential point, an eleventh switching element connected between an output terminal of said third switched capacitor circuit and the other terminal of said third capacitor, and a twelfth switching element connected between said other terminal of said third capacitor and said first fixed potential point, a fourth switched capacitor circuit for receiving said second signal voltage, said fourth switched capacitor circuit having a thirteenth switching element connected between an input terminal of said second signal voltage and one terminal of a fourth capacitor, a fourteenth switching element connected between said one terminal of said fourth capacitor and said second fixed potential point, a fifteenth switching element connected between an output terminal of said fourth switched capacitor circuit and the other terminal of said fourth capacitor, and a sixteenth switching element connected between said other terminal of said fourth capacitor and said first fixed potential point, said fourth switched capacitor circuit matching with said third switched capacitor circuit, and a second differential voltage comparator having first and second input terminals for receiving outputs from said fourth and third switched capacitor circuits, respectively, said ninth, eleventh, fourteenth, and fifteenth switching elements being driven by said first control clock signal, and said tenth, twelfth, thirteenth, and sixteenth switching elements being turned on/off by said second control clock signal; and
an OR circuit for ORing outputs from said first and second voltage comparator circuits.

6. A circuit according to claim 5, wherein said first and second differential voltage comparators are respectively sampled data differential input voltage comparators for performing offset compensation with a voltage held by a capacitor connected to its output side.

7. A limiter circuit comprising:
a first voltage comparator comprising a first switched capacitor circuit for receiving a first signal voltage to be compared, said first switched capacitor circuit having a first switching element connected between an input terminal of said first signal voltage and one terminal of a first capacitor, a second switching element connected between said one terminal of said first capacitor and a first fixed potential point, a third switching element connected between an output terminal of said first switched capacitor circuit and the other terminal of said first capacitor, and a fourth switching element connected between the other terminal of said first capacitor and said first fixed potential point, a second switched capacitor circuit for receiving a second signal voltage to be compared, said second switched capacitor circuit having a fifth switching element connected between an input terminal of said second signal voltage and one terminal of a second capacitor, a sixth switching element connected between said one terminal of said second capacitor and a second fixed potential point, a seventh switching element connected between an output terminal of said second switched capacitor circuit and the other terminal of said second capacitor, and an eighth switching element connected between the other terminal of said second capacitor and said first fixed potential point, said second switched capacitor circuit matching with said first switched capacitor circuit, and a first differential voltage comparator having first and second input terminals for receiving outputs from said first and second switched capacitor circuits, respectively, said first, third, fifth, and seventh switching element being driven by a first control clock signal, and said second, fourth, sixth, and eighth switching elements being turned on/off by a second control clock signal which is complementary with said first control clock signal and is not enabled simultaneously therewith;

a second voltage comparator circuit comprising a third switched capacitor circuit for receiving said first signal voltage, said third switched capacitor circuit having a ninth switching element connected between said input terminal of said first signal voltage and one terminal of a third capacitor, a tenth switching element connected between said one terminal of said third capacitor and said first fixed potential point, an eleventh switching element connected between an output terminal of said third switched capacitor circuit and the other terminal of said third capacitor, and a twelfth switching element connected between said other terminal of said third capacitor and said first fixed potential point, a fourth switched capacitor circuit for receiving said second signal voltage, said fourth switched capacitor circuit having a thirteenth switching element connected between an input terminal of said second signal voltage and one terminal of a fourth capacitor, a fourteenth switching element connected between said one terminal of said fourth capacitor and said second fixed potential point, a fifteenth switching element connected between an output terminal of said fourth switched capacitor circuit and the other terminal of said fourth capacitor, and a sixteenth switching element connected between said other terminal of said fourth capacitor and said first fixed potential point, said fourth switched capacitor circuit matching with said third switched capacitor circuit, and a second differential voltage comparator having first and second input terminals for receiving outputs from said fourth and third switched capacitor circuits, respectively, said ninth, eleventh, fourteenth, and fifteenth switching elements being driven by said first control clock signal, and said tenth, twelfth, thirteenth, and sixteenth switching elements being turned on/off by said second control clock signal; and a selector, responsive to outputs from said first and second differential voltage comparators of said first and second voltage comparator circuits, for selectively outputting any one of said first signal voltage, a voltage higher than said first fixed potential by said second signal voltage, and a voltage lower than said first fixed potential by said second signal voltage.

8. A limiter circuit comprising:

a window comparator for receiving first and second signal voltages to be compared, and for discriminating a correspondence between said first signal voltage and any one of a first state in which said first signal voltage is higher than an upper limit voltage obtained by adding said second signal voltage to a first fixed potential, a second state in which said first signal voltage is lower than a lower limit voltage obtained by subtracting said second signal voltage from said first fixed potential, and a third state in which said first signal voltage falls within a range between said upper and lower limit voltages;

a first switched capacitor circuit for receiving said first signal voltage, said first switched capacitor circuit having a first switching element connected between an input terminal of said first signal voltage and one terminal of a first capacitor, a second switching element connected between said one terminal of said first capacitor and a first fixed potential point, a third switching element connected between an output terminal and the other terminal of said first capacitor, and a fourth switching element connected between said other terminal of said first capacitor and said first fixed potential point;

a second switched capacitor circuit for receiving said second signal voltage, said second switched capacitor circuit having a fifth switching element connected between an input terminal of said second signal voltage and one terminal of a second capacitor, a sixth switching element connected between said one terminal of said second capacitor and a second fixed potential point, a seventh switching element connected between said output terminal and the other terminal of said second capacitor, and an eighth switching element connected between said other terminal of said second capacitor and said first fixed potential point, and said second switched capacitor circuit matching with said first switched capacitor circuit;

a third switched capacitor circuit for receiving said second signal voltage, said third switched capacitor circuit having a ninth switching element connected between said input terminal of said second signal voltage and one terminal of a third capacitor, a tenth switching element connected between said one terminal of said third capacitor and said second fixed potential point, an eleventh switching element connected between said output terminal and the other terminal of said third capacitor, and a twelfth switching element connected between said other terminal of said third capacitor and said first fixed potential point, and said third switched capacitor circuit matching with said first switched capacitor circuit; and a switch controller for turning on/off a first switch group comprising said first, third, fifth, seventh, tenth, and eleventh switching elements and a second switch group comprising said second, fourth, sixth, eighth, ninth, and twelfth switching elements complementarily such that said first and second switch groups are not turned on simultaneously, and, responsive to a discrimination result of said window comparator, for turning off said third and eleventh switching elements when said first state is obtained, said third and seventh switching elements when said second state is obtained, and said seventh and eleventh switching elements when said third state is obtained, regardless of on/off control of said first and second switch groups.

* * * * *